United States Patent
Saldana et al.

(10) Patent No.: US 6,276,563 B1
(45) Date of Patent: Aug. 21, 2001

(54) VERIFICATION AND LOCKOUT APPARATUS FOR BULK FEEDER

(75) Inventors: Joe M. Saldana, New Braunfels; Andrew D. Alexander, II, Seguin; Michael J. Pomeroy, New Braunfels, all of TX (US); Richardo Garza, Warren, MI (US); Richard W. Arnold, Jr.; James L. McGovern, both of Seguin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/416,324

(22) Filed: Oct. 12, 1999

(51) Int. Cl.⁷ ..................................................... B65G 47/12
(52) U.S. Cl. .......................... 221/154; 222/174; 222/197; 222/287; 414/403
(58) Field of Search .......................... 414/403; 141/346; 221/154, 174, 197, 287

(56) References Cited

U.S. PATENT DOCUMENTS

| | | | |
|---|---|---|---|
| 4,846,345 | * 7/1989 | Hamuro et al. | 206/701 |
| 4,889,229 | * 12/1989 | Yamamoto et al. | 206/723 |
| 4,982,587 | * 1/1991 | Tzou | 70/492 |
| 5,402,216 | * 3/1995 | Komaki et al. | 355/260 |
| 5,588,318 | * 12/1996 | Osborne | 70/469 |
| 5,934,505 | * 8/1999 | Shimada | 221/236 |
| 6,094,953 | * 8/2000 | Evans | 70/278.1 |
| 6,161,676 | * 12/2000 | Takahashi et al. | 198/396 |

* cited by examiner

Primary Examiner—Steven A. Bratlie
(74) Attorney, Agent, or Firm—John J. King

(57) ABSTRACT

A bulk component feeder is provided for delivering components contained with a bulk cassette. The feeder includes a feeder housing defining a component cassette receiving area. The receiving area includes a cassette mounting means for registration with the cassette, and the housing defines an opening for receiving components from the cassette. A gate slidable within the cassette receiving area interfaces with a mounting means, and the gate is slidable to cover the opening in a closed position and uncover the opening in an open position upon attachment of the cassette to the housing. A spring is used to bias the gate toward the closed position, and a latch is mounted to the housing and is engagable with the gate to prevent sliding of the gale toward the open position and thereby prevent installation of the cassette.

23 Claims, 5 Drawing Sheets

VERIFICATION AND LOCKOUT APPARATUS FOR BULK FEEDER

BACKGROUND OF THE INVENTION

The present invention relates to bulk feeding devices used in the automated installation of printed circuit board components. In particular, the invention relates to a verification and lockout apparatus for a circuit component bulk feeder.

The ability to automate the selection and installation of surface-mounted electronic components to printed circuit board has improved the efficiency and speed of solid-state manufacturing. In modern circuit-building operations, bulk components are fed individually and automatically to surface-mounting machinery. The mounting machinery orients the components relative to the boards and installs them onto the boards. Separate or concurrent operations may then be implemented to solder or otherwise fuse the components to circuit vias on the boards.

Modern circuit mounting machinery typically operates very rapidly, and component installation operations can install several thousand component parts in a matter of minutes. These machines will often rapidly deplete component containers which are used to supply a bulk quantity of components to the installation machinery. This rapid depletion requires machine operators to constantly monitor the status of the machine supplies and change supply containers frequently.

In these mounting machines, bulk quantities surface-mount components are often supplied from cartridges or cassettes. Typically, the cassettes are installed using a common slidable interface with a feeder apparatus. The feeder apparatus transfers individual circuit parts from the inside of the bulk cassette to the mounting machinery. The bulk feeders are individually pre-configured to feed a particular kind of part to the mounting apparatus.

If a cassette containing one type of part is mistakenly installed onto a feeder configured to feed a different type of part, the feeder may malfunction and become jammed or damaged due to differences in the size or shape of the particular component part. More catastrophically, incorrect parts may be installed in an improper position on the circuit board, thereby rendering the board inoperable. This may result in wasted boards and components. At a minimum, the installation of an improper cassette can cause production lines to shut down and the overall efficiency of the board-mounting operation to decrease.

SUMMARY OF THE INVENTION

In accordance with the present invention, a bulk circuit component feeder is provided including a lockout apparatus for preventing the installation of an improper cassette to the feeder. The invention may be embodied in a bulk feeder for delivering components contained within a cassette. The feeder comprises a feeder housing defining a component cassette receiving area. The receiving area includes a cassette mounting means for registration with the cassette, and the housing further defines an opening for receiving components from the cassette. A gate slidable within the cassette receiving area interfaces with the mounting means. The gate is slidable to cover the opening in a closed position and uncover the opening in an open position upon the attachment of the cassette to the housing. A spring is positioned to bias the gate toward the closed position, and a biased and releasable latch is engagable with the gate for preventing sliding of the gate toward the open position.

In another aspect of the invention, a bulk circuit component feeder is provided that includes a feeder housing and a cassette receiving area on the housing. The receiving area includes a pair of spaced apart sidewalls adapted to receive the cassette therebetween, and a gate slidably mounted therein. The gate is being slidably displaceable by a portion of the cassette from a closed position to an open position during insertion of the cassette into the receiving area. A spring is positioned to bias the gate toward the closed position and a plunger extends from the housing to selectively prevent the slidable displacement of the gate by the cassette, thereby preventing the insertion of the cassette into the receiving area.

In yet another aspect of the invention, a method is provided supplying a plurality of circuit components for installation to a circuit board. The method includes the steps of providing a bulk cassette containing a plurality of circuit components, providing at least one bulk component feeder for delivering the components to a component mounting device, scanning the identification means on the cassette to determine the type of bulk components in the bulk cassette, and releasing the latch based on the determination to allow the gate to uncover the opening. The feeder includes a housing defining a mounting means for registration with the cassette and an opening for receiving components from the cassette, a gate mounted on the housing to slidably cover the opening, and a latch releasably engageable with the gate to prevent the sliding of the gate.

It is to be understood that both the foregoing general description and the following detailed description are exemplary and explanatory and are intended to provide further explanation of the invention as claimed. The invention, together with further objects and attendant advantages, will best be understood by reference to the following detailed description, taken in conjunction with the accompanying drawings.

DETAILED DESCRIPTION OF THE PRESENTLY PREFERRED EMBODIMENTS

Figure 1:
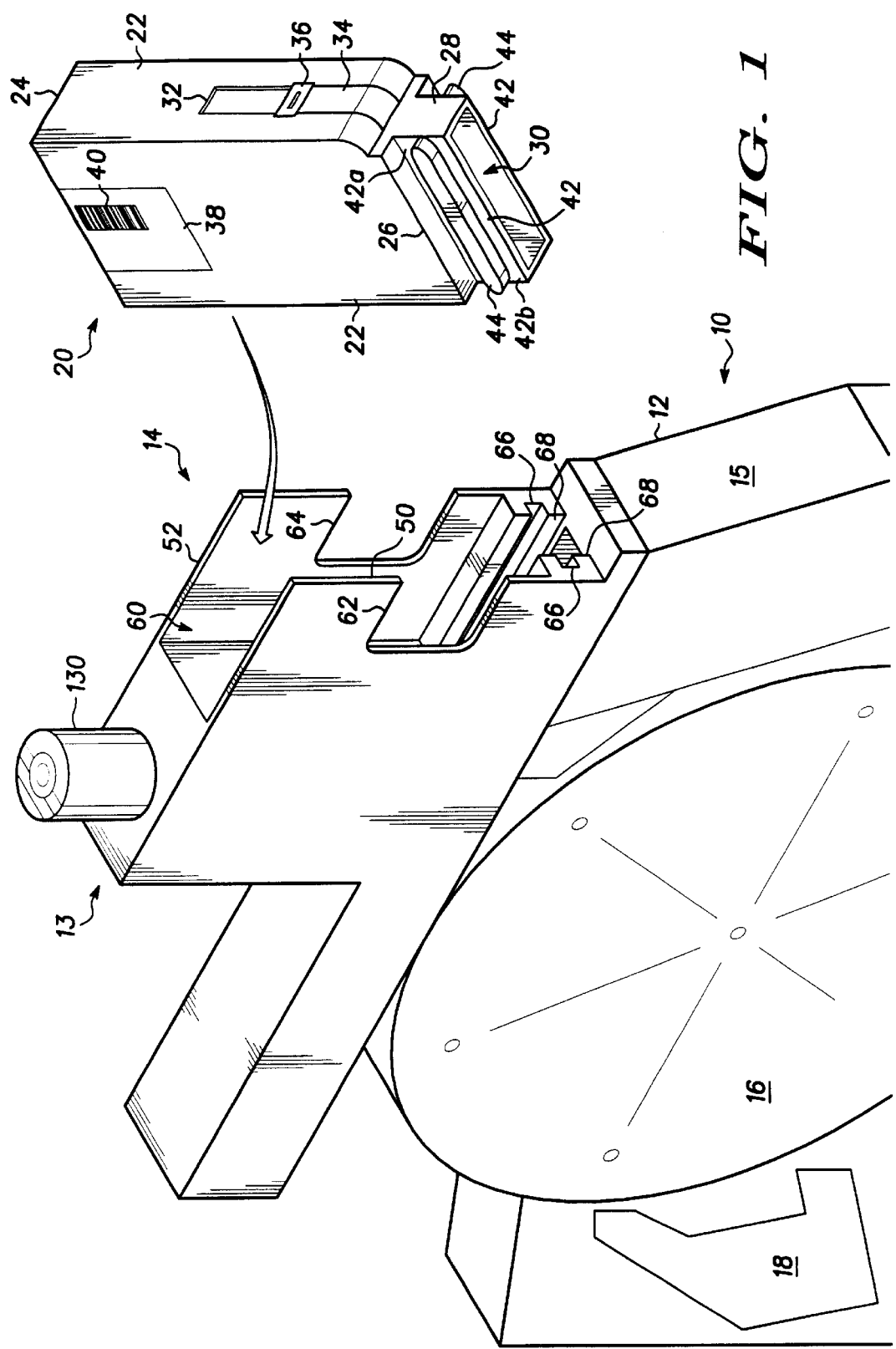
FIG. 1 is a perspective view of a bulk component feeder of the present invention including a gating apparatus and an uninstalled bulk cassette.
Figure 2:
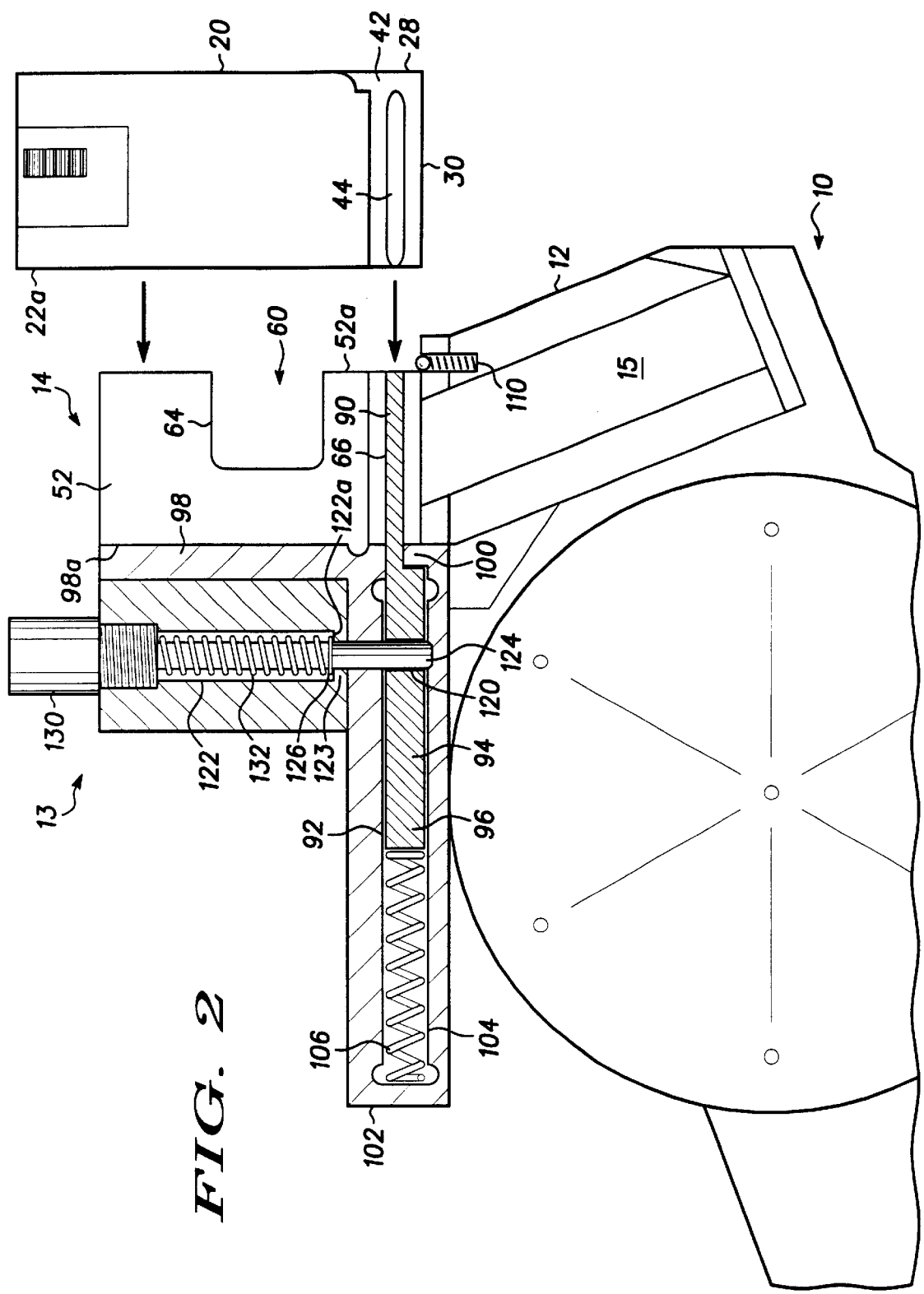
FIG. 2 is a cutaway side view taken along line 2—2 in FIG. 1.

FIG. 1 shows a perspective view of the bulk component feeder 10 of the present invention. The feeder 10 includes a housing 12 surrounding the mechanical componentry of the feeder. The housing 12 includes a lockout apparatus 13 further including a cassette receiving area 14 mounted on an upper portion of the feeder 10. Preferably, the feeder housing 12 contains an internal parts distribution wheel 16 and a parts advancing apparatus 18. Preferably, in accordance with the present invention, the upper portion of the housing 12 of the conventional feeder 10 includes a lockout apparatus 13. The lockout apparatus 13 may be fitted atop a conventional feeder housing 10, or otherwise integrated therewith. In the preferred embodiment, the lockout apparatus 13 is affixed atop a Fuji Model BF-002052 component feeder as shown in FIG. 2.

Figure 3:
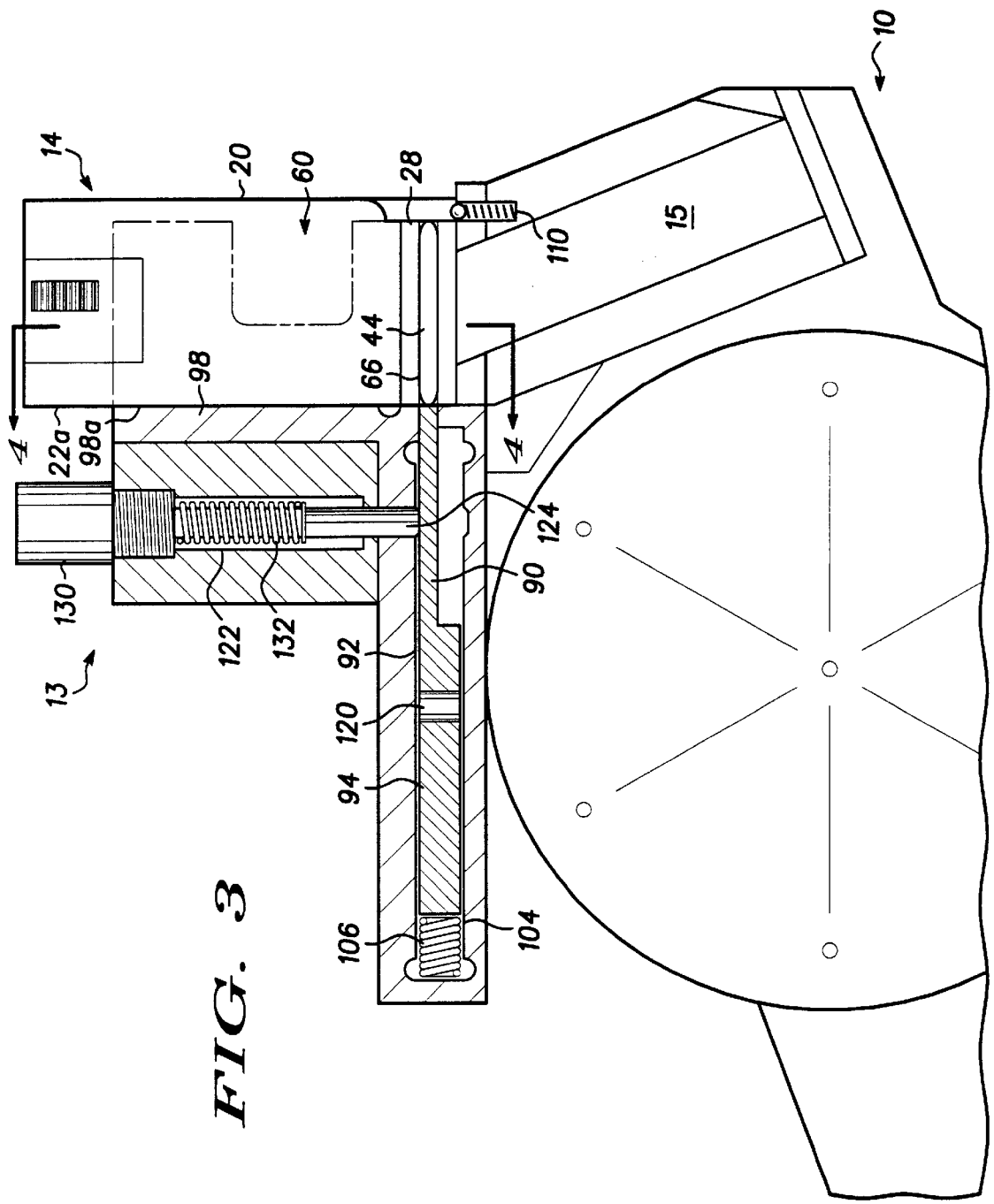
FIG. 3 is a cutaway side view similar to FIG. 2 with the bulk cassette installed onto the gating apparatus of the bulk component feeder.

In this configuration, a lower portion of the lockout apparatus defines a component delivery chute 15, which extends into the body of the feeder 10. Preferably, as shown in FIGS. 1–3, the chute 15 is sized to fit within an area of the feeder 10 normally sized to receive a conventional parts cassette 20. Thus, the lockout apparatus described below provides an alternate cassette receiving device for delivering bulk component parts through the chute 15 to the feeder 10.

A bulk component cassette 20 is shown aligned with and detached from the feeder 10. The bulk cassette 20 preferably defines a hollow, rectangularly-shaped container including side walls 22, top wall 24 and bottom wall 26. The cassette 20 is preferably configured to hold a quantity of surface-mounted electronic parts in loose fashion within the interior of the container area of the cassette. For purposes of the present disclosure, the bulk component cassette 20 described herein is generally conventional within the industry. For example, cassettes of this type containing loose component parts in bulk quantities, such as surface-mount resistors, are available through Rohm Co., Ltd., of Kyoto Japan.

A mounting member 28 protrudes downwardly from the bottom wall 26 of the cassette 20. The mounting member 28 is configured with mounting means for slidable reception within the cassette receiving area 14 of the housing 12. Preferably, the lower portion of the member 28 defines a component part exit opening 30. The opening 30 opens into the interior of the cassette. Preferably, one of the side walls 22 of the cassette 20 defines a grooved track 32 which leads under the member 28 and over the opening 30. The track 32 preferably engages a slidable and deformable metal slide gate 34, which is in turn attached to a thumb push lever 36. By moving the lever 36 upwardly toward the top wall 24 of the cassette 20, the gate 34 may be raised within the track 32 to allow components to exit from the interior of the cassette 20, through the member 28, and in turn out through the opening 30. The lever 36 therefore operates to open and close the opening 30 in the cassette 20.

Preferably, one of the side walls 22 of the cassette 20 includes a surface-mounted label 38 that indicates the type of components contained within the cassette 20. The label may contain information such as the size, rating and quantity of the bulk component items, as well as the manufacturer and packaging date of the components. Preferably, the label 38 includes a bar code symbol 40 printed thereon which corresponds to particular components.

The bottom portion of mounting member 28 on the cassette 20 includes a pair of preferably parallel side walls 42. A flange 44 extends parallel to the long edge of the side wall 42 preferably parallel to the bottom wall 26 of the cassette 20. The elongated flange 44 extends outwardly from the side wall 42 and separates the side wall 42 into an upper portion 42a above the flange 44, and a lower portion 42b below the flange 44. The side walls 42 of the member 28 preferably define a slightly reduced width than the side walls 22 on the cassette 20.

The cassette receiving area 14 of the feeder 10 includes a pair of upstanding side walls 50 and 52. The upstanding side walls 50 and 52 define a rearwardly facing cassette receiving area 60 for slidably receiving at least a bottom portion of the bulk cassette 20. Each of the side walls 50 and 52 preferably defines a cut out 62 and 64, respectively, so that a user may remove a cassette 20 easily. The interior sides of each of the side walls 50 and 52 define on their lower portion a groove 66 extending horizontally toward the interior of the cassette receiving area 60. The grooves 66 are sized to receive the flanges 44 on the mounting member 28 of the cassette 20.

A pair of lower walls 68 are defined surrounding the grooves 66 on the interior of side walls 50 and 52 to reduce the separation of the side walls 50 and 52 in the area adjacent the grooves 66. Thus, as shown in FIG. 1, the bulk cassette 20 may be oriented as shown in the figure for slidable insertion into the cassette receiving area 60. In this configuration, the flanges 44 on the mounting member 28 are received within the grooves 66 of the side walls 50 and 52. This allows the cassette 20 to be properly aligned relative to the cassette receiving member 14 and the feeder 10.

FIG. 2 shows a side view of the apparatus shown in FIG. 1 taken along line 2—2. As shown in FIG. 2 and as can be seen in FIG. 1, an elongated gate 90 extends throughout the length of the cassette receiving member and a portion 92 of the groove 66. The gate 90 is preferably integral with a slide 94 in the forward portion of the receiving member 14. The gate 90 is preferably of a thickness similar to that of the flange 44 of the cassette 20, and extends nearly to the outermost edge 52a of the side wall 52. The gate 90 comprises a rearward portion of the slide 94. A forward portion 96 of the slide 94 is of slightly more thickness than the gate portion 90, and the forward portion of the portion 92 is widened to accommodate the thicker portion 96. As shown in FIG. 2, a bulkhead 98 formed on the interior side of side wall 52 defines portion 92 of the groove 66. A transition threshold 100 is formed in the bulkhead 98 between portion 92 which is generally wider and portion 66 which is generally narrower. In this configuration, the slide 94 is thereby prevented from sliding rearwardly past the position shown in FIG. 2 wherein the rearward end of the slide 94 is butted against the threshold 100.

The slide 94 and the gate portion 90 are slidable forwardly of the position shown in FIG. 2 within portion 92. A forward portion 102 of the bulkhead 98 forms an extended slide receiving area 104 for receiving the forward portion 96 of the slide 94 when the slide 94 is moved forward relative to the bulkhead 98. A coil spring 106 is preferably installed within the receiving area 104 to bias the forward portion of the slide and the gate portion 90 rearwardly so that the slide 94 rests against the threshold portion 100. This is the position shown in FIG. 2 or the "closed" position.

When in the closed position, the mounting member 28 of the cassette 20, as aligned by the grooves 44, will push the gate portion 90 and the slide 94 forwardly within the bulkhead 98 to compress the slide return spring 106. This will slide the gate portion 90 to the "open" position. When the gate portion 90 is in the fully opened position, and the cassette 20 is fully installed within the cassette receiving area 60, the forward edge 22a of the cassette 20 will rest against the outer edge 98a of the bulkhead 98.

FIG. 3 shows the preferred embodiment of the present invention with the parts cassette 20 installed into the cassette receiving area 60. As shown, the slide 94 is advanced to a forward position compressing the spring 106 within the slide receiving area 104.

The gate 90 is depressed into portion 92 of the groove 66 to allow the mounting member 28 of cassette 20 to be installed into the cassette receiving area 60. As described above, the flanges 44 of cassette mounting member 28 are received within narrowed grooves 66.

Figure 4:
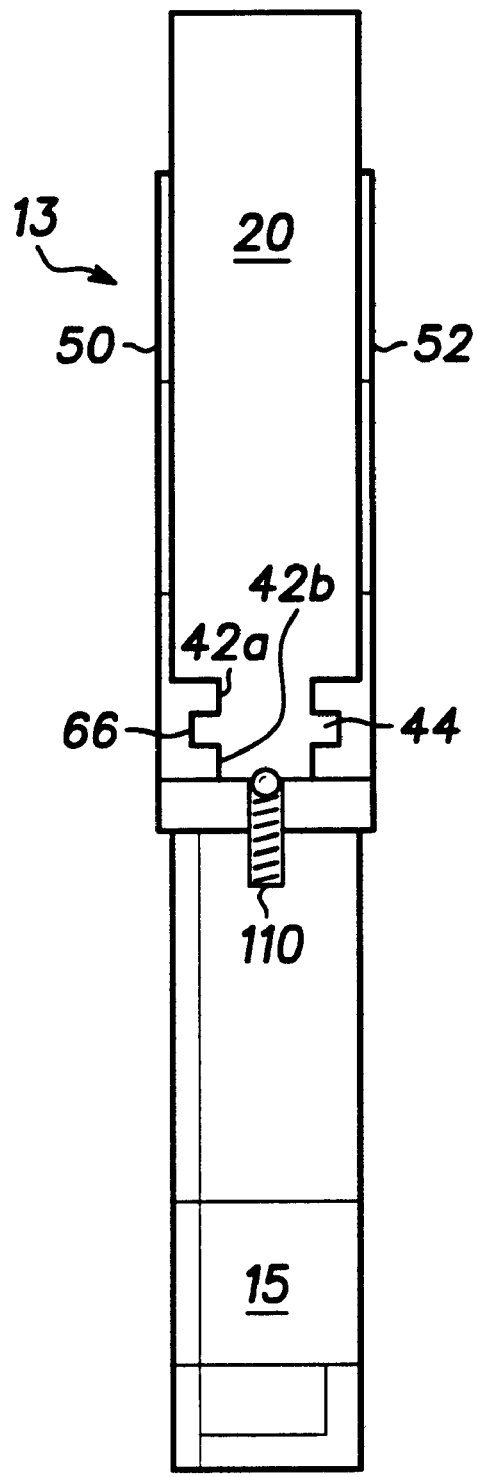
FIG. 4 is a cutaway side view taken along line 4—4 of FIG. 3.

FIG. 4 shows a side view taken along line 4—4 of FIG. 3, and shows the cassette 20 properly installed between side walls 50 and 52 of the lockout apparatus 13. As shown in FIGS. 3 and 4, a conventional spring-loaded ball plunger preferably consisting of a ball bearing and a spring, extend upwardly from the housing 14 near the outer portion of the cassette receiving area 60. The ball plunger helps to retain the cassette 20 in the installed position within the cassette receiving area 60 by restricting rearward movement of the mounting member 28 on the cassette 20 relative to the housing 14.

Returning now to FIGS. 2 and 3, the slide 94 defines a circular opening 120. When the slide 94 is positioned so that the gate 90 is in the closed position as shown in FIG. 2 and the cassette 20 is uninstalled, the opening 120 is aligned with a vertically extending cylindrical bore 122 defined within bulkhead 98.

An elongated, cylindrical plunger 124 extends within the bore 122. Preferably, the plunger 124 is made of stainless steel and is of a diameter smaller than the bore 122. A lower portion 122a of the bore 122 is of a slightly reduced diameter portion, thereby forming a threshold area 123 within the bulkhead 98.

Preferably, one or more E-clips are placed around a circumferential groove defining a lower portion of the plunger 124. The E-clips, which are thereby rigidly connected to the plunger 124, rest on the threshold 123 of the bulkhead 98. A portion of the plunger 124 extending below the E-clips 126 extends below the bulkhead 98, through portion 92 and through the bore 120 of the slide 94. Thus, when in this position, the plunger 124 forms a deadbolt-type latch which projects transversely through the hole 120, thereby preventing the slide 94 and gate portion 90 from sliding horizontally from the closed position shown in FIG. 2 to the open position shown in FIG. 3.

In order to lift the plunger 124 and release the slide by removing the lower portion of the plunger 124 from the hole 120, a solenoid coil 130 is provided. As shown in FIG. 2, the solenoid coil 130 is oriented over the plunger 124 and mounted preferably threadably to the bulkhead 98 over the board 122. Preferably, the plunger is a model T4X7 manufactured by Guardian Electric, Inc. and rated at 24 volts DC. Of course, any known solenoid device, or other electric device capable of moving the plunger may be utilized for this function. A compression spring 132 is provided within the bore 122 around the plunger 124 to bias the E-clips 126 and the shaft 124 downwardly relative to the bulkhead 98. When a voltage is applied to the solenoid coil 130, the solenoid coil 130 retracts the plunger within the coil, and thereby pulls the plunger 120 out from the hole 120 in the slide 94. In this position, the gate portion 90 is now movable to the open position, and the cassette 20 may now be inserted into the cassette receiving area 60. Thus, the cassette 20 cannot be inserted into the cassette receiving area 60 when the solenoid is not actuated. Upon the de-activation of the solenoid 130, the spring 132 continues to bias the plunger 124 downwardly. If the slide is in the closed position and the cassette is removed, the plunger 124 will descend into the hole 120 of the slide 94, thereby locking the gate 90 into the closed position. If the solenoid coil 130 is not actuated while the gate 90 is in the open position and the cassette is installed, the plunger will simply be urged against the gate portion 90 by the spring 132 as shown in FIG. 3. When the parts cassette is removed from the cassette receiving area 60, the plunger 124 will allow the slide to be urged back to the closed position by the spring 106. The spring 132 will urge the plunger 124 through the hole 120 when the slide 94 and the gate 90 reach the fully closed position and the hole 120 is aligned with the bottom of the shaft of the plunger 124.

Thus, the lockout assembly 13, including the latching means described, may be utilized to prevent the installation of a cassette onto the feeder 10 unless the lock out device 13 is unlocked.

The operation of the apparatus described above is as follows. Preferably, the feeder 10 and the lockout apparatus 13 are linked to a central processing computer which monitors the status of the devices and is capable of controlling the solenoid 130. Other control devices may be utilized, such as simple microprocessors, logic circuits, and software.

Figure 5:
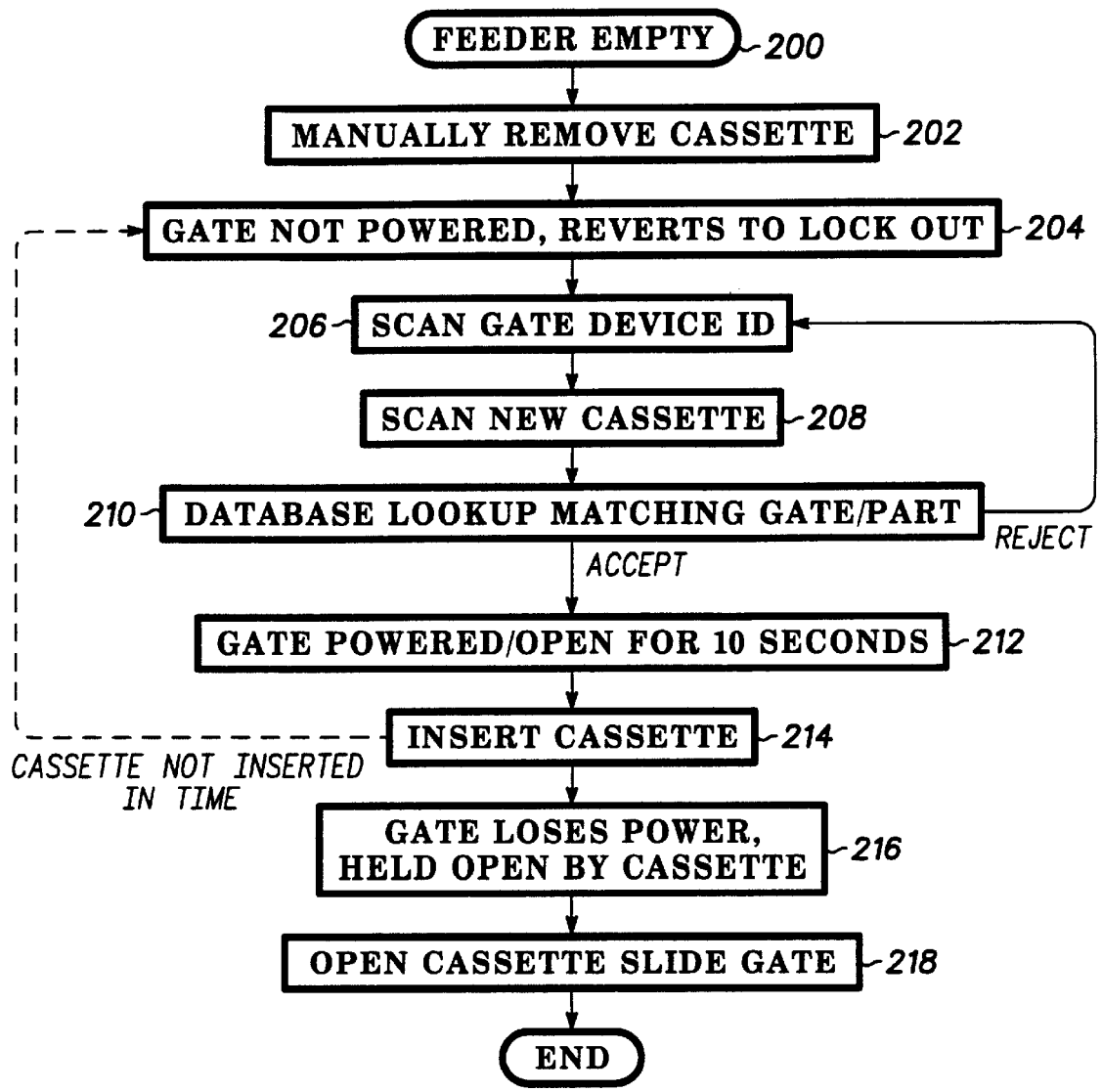
FIG. 5 is a flow diagram illustrating a method of the present invention utilizing the apparatus shown in FIGS. 1–4.

As shown in the flow diagram of FIG. 5, the computer described above preferably will detect when the feeder 10 has depleted its bulk component supply. This is shown in step 200. The depletion of components may be sensed by photoelectric means, counters or other conventional detection devices. Next, as shown in box 202, an operator may manually remove the empty cassette 20 from the cassette receiving area 60. At this point, as shown in box 204, the solenoid 130 is not powered, and the slide is urged by the return spring 104 to return to the closed position shown in FIG. 2. In this position, a cassette cannot be inserted to the cassette receiving area 60 until the solenoid 130 is actuated to release the plunger 124.

In order to insert a new cassette 20 containing a new supply of component parts, the identification of the feeder 10 or lockout device 13 is first determined by scanning a identification code (not shown) preferably on the device 13 or feeder 10. This step is shown in box 206. The scanning may be performed through any conventional means, such as bar-code reading via a laser scanner, reading of a magnetic stripe or keyboard entry of an identification code by the operator.

After the device ID is scanned, the identification code 40 of a new cassette 20 is then scanned using similar means, as shown at box 208. The computer then preferably reviews is stored database to verify whether the parts contained within the scanned cassette match the parts acceptable for the particular feeder 10 (box 210). If the feeder 10 and the cassette 20 do not match, the cassette 20 is rejected and the user is prompted to try scanning another cassette. If the cassette 20 is acceptable, the solenoid 130 is activated and the gate 90 is released for 10 seconds (box 212). When the gate 90 is unlocked, the user can insert the new scanned cassette as shown in box 214. At the end of a ten second period, the solenoid 130 is de-activated and the plunger 124 is released. However, the gate 90 is held open by the presence of the new parts cassette 20, as shown at box 216. Finally, as shown in box 218, the user preferably manually opens the slide gate 36 of the cassette 20 to allow the parts to descend through the opening 30 and into the feeder 10 through the components delivery chute 15.

Of course, it should be understood that a wide range of changes and modifications can be made to the preferred embodiments described above. For example, latching means described herein, including the plunger which is operated by the solenoid 130, may be replaced with equivalent structures or other devices to prevent movement of the gate 90. Such devices can include a motorized lock, a threaded and motorized deadbolt, or even a magnetic lever. Furthermore, the parts cassette may be prevented from being installed onto the feeder 10 or the receiving area 60 by a larger structure that hinders installation of the cassette. For example, instead of the gate portion 90 preventing the installation of only the mounting member 28 of the cassette 20, a latch, spring-loaded door or other blocking device may be utilized to prevent registration between the cassette and the device 10. Moreover, other identification or verification methods may be utilized to match the parts cassette with the particular feeder, including photoelectric color-readers, mechanical keying, or centers that magnetically link the cassette with the gate release mechanism. Thus, it is intended that the foregoing detailed description be regarded as illustrative rather than limiting, and that it be understood that it is the following claims, including all equivalents, which are intended to define the scope of this invention.

What is claimed is:

1. A bulk circuit component feeder for delivering components contained within a cassette, said feeder comprising:

a feeder housing defining a component cassette receiving area, said receiving area including a cassette mounting means for registration with said cassette, said housing defining an opening for receiving components from said cassette;

a gate slidable within said cassette receiving area of said housing and interfacing with said mounting means, said gate slidable to cover said opening in a closed position and uncover said opening in an open position upon the attachment of said cassette to said housing;

a spring positioned to bias said gate toward said closed position; and a biased latch mounted to said housing and engageable with said gate for preventing sliding of said gate toward the open position.

2. The invention of claim 1 wherein said latch further comprises a plunger extendable from said housing through an opening defined in said gate when in said closed position, wherein said plunger prevents movement of said gate toward said open position.

3. The invention of claim 2 further comprising a solenoid linked to said plunger for raising said plunger from said opening defined in said gate upon activation of said solenoid to thereby disengage said latch from said gate.

4. The invention of claim 3 wherein said plunger is biased toward said gate.

5. The invention of claim 4 wherein said solenoid is fixed to said housing.

6. The invention of claim 3 wherein said cassette includes a mounting member slidably engageable with said mounting means of said receiving area, said mounting member configured to slidably displace said gate toward said open position upon engagement with said mounting means.

7. The invention of claim 1 further comprising first identification means mounted on said cassette; second identification means associated with said feeder; and a scanning device for reading said first and second identification means.

8. The invention of claim 5 further comprising processing means for determining whether said cassette is properly authorized for installation to said feeder.

9. The invention of claim 8 further comprising a memory storing data relating to the components contained within said cassette having a first identification means, said memory in communication with said processing means, wherein said processing means compares the data read by a scanning device with information in said memory.

10. The invention of claim 9 wherein said solenoid is linked to said processing means, said processing means being able to activate said solenoid upon determining that said cassette is properly authorized for installation to said feeder.

11. The invention of claim 10 further comprising timing means in communication with said processing means, said timing means for deactivating said solenoid after a preset period of time.

12. A bulk circuit component feeder for delivering components contained within a component cassette, said feeder comprising:

a feeder housing;

a cassette receiving area on said housing, said receiving area including a pair of spaced apart sidewalls adapted to receive said cassette therebetween;

a gate slidably mounted within said cassette receiving area, said gate being slidably displaceable from a closed position to an open position by a portion of said cassette to allow insertion of said cassette into said receiving area, said gate being biased toward said closed position; and a plunger mounted to said housing and configured to selectively prevent the slidable displacement of said gate by said cassette, thereby preventing the insertion of said cassette into said receiving area.

13. The invention of claim 12 further comprising alignment means on said housing for registration with said cassette to guide said cassette into position during insertion of said cassette into said receiving area.

14. The invention of claim 13 wherein said plunger is extendable between said housing and an opening defined in said gate when in said closed position, wherein said plunger prevents movement of said gate toward said open position.

15. The invention of claim 14 further comprising a solenoid mounted on said housing for raising said plunger from said opening defined in said gate upon activation of said solenoid.

16. The invention of claim 15 wherein said plunger is biased toward said gate.

17. The invention of claim 15 further comprising first identification means mounted on said cassette; second identification means associated with said feeder; and a scanning device for reading said first and second identification means.

18. The invention of claim 17 further comprising verification means for determining whether said cassette is properly authorized for installation to said feeder.

19. The invention of claim 18 further comprising a memory storing data relating to the components contained within said cassette having said first identification means; said memory in communication with said verification means, wherein said verification means compares the data read by said scanning device from said first and second identification means with information in said memory.

20. The invention of claim 19 wherein said solenoid is linked to said verification means, said verification means being able to activate said solenoid upon determining that said cassette is properly authorized for installation to said feeder.

21. The invention of claim 20 further comprising timing means in communication with said verification means, said timing means for deactivating said solenoid after a preset period of time.

22. A method for supplying a plurality of circuit components for installation to a circuit board, said method comprising the steps of:

providing a bulk cassette containing a plurality of circuit components, said cassette defining at least one opening for supplying said components therethrough, said cassette including mounting grooves and an identification means on said cassette for identifying the type of bulk components contained in said cassette;

providing at least one bulk component feeder for delivering said components to a component mounting device, said feeder including a housing defining a mounting means for registration with said grooves on said cassette and an opening for receiving components from said cassette, a gate mounted on said housing to slidably cover said opening, and a latch releasably engageable with said gate to prevent the sliding of said gate;

scanning the identification means on said cassette to determine the type of bulk components in said bulk cassette; and releasing said latch based on said scanning to allow said gate to uncover said opening.

23. The method of claim 22 further comprising the steps of scanning the identification means on said bulk component feeder and determining whether the bulk component feeder is authorized to accept the type of bulk components in said bulk cassette.

* * * * *